United States Patent [19]

Charruau

[11] Patent Number: 4,958,258
[45] Date of Patent: Sep. 18, 1990

[54] MODULAR HYBRID MICROELECTRONIC STRUCTURES WITH HIGH DENSITY OF INTEGRATION

[75] Inventor: Stephane Charruau, Eysines, France
[73] Assignee: Thomson CSF, Paris, France
[21] Appl. No.: 287,285
[22] Filed: Dec. 21, 1988
[51] Int. Cl.⁵ .......................... H05K 1/18; H05K 7/20
[52] U.S. Cl. ..................................... 361/386; 361/412
[58] Field of Search ............... 361/392, 395, 396, 412, 361/413, 414, 415, 424, 386

[56] References Cited

U.S. PATENT DOCUMENTS 4,208,698  6/1980  Narasimhan .
4,731,699  3/1988  Nitta et al. .......................... 361/386

FOREIGN PATENT DOCUMENTS 0083405  3/1983  European Pat. Off. .
0176245  4/1986  European Pat. Off. .
0211619  2/1987  European Pat. Off. .
0228212  7/1987  European Pat. Off. .
8102367  8/1981  World Int. Prop. O. .

OTHER PUBLICATIONS

Abrege Inspec Nr. B87017566, vol. 26, No. 9, Sep. 1986, pp. 28 ∝ 29, Londres, GB.

J. Angeloni: "VLSI Hybrids are Built with Nuclear Parts", & Electronic Packaging & Prod.
IBM Technical Disclosure Bulletin, vol. 19, No. 12, May 1977, p. 4541, Armonk, NY, US:.
V. D. Vanvestrout: "Hybrid Module Including Thin--Film Conductors and Pate Resistors"* Document Complet*.

*Primary Examiner*—Roy N. Envall, Jr.
*Attorney, Agent, or Firm*—Cushman, Darby & Cushman

[57] ABSTRACT

A preferred embodiment comprises, on one face, an encapsulated hybrid circuit that groups together circuits with high density of integration, formed by one or more semiconductor chips, said circuits being mounted on a thin-layer substrate. The thin-layer substrate is grown on one face of a supporting, thick-layer substrate, preferably made of co-baked ceramic. Encapsulate, microelectronic components such as monolithic, integrated circuits are borne on the other face of the substrate. The interconnections among various components and with the exterior are made within and through the layers of the supporting substrate so that no wire or connection appears on the uncovered parts of the substrate. A detachable, elastomer connection scheme enables the connection of the input/output interconnection terminals of the module with the exterior.

15 Claims, 4 Drawing Sheets

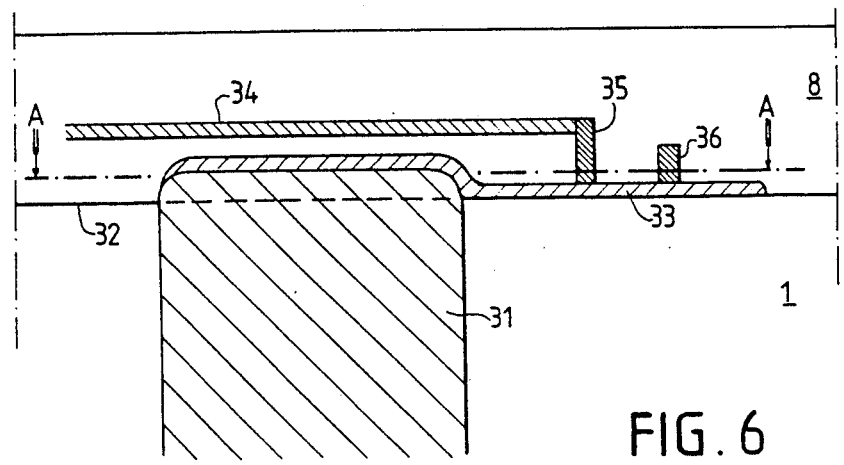
FIG. 6
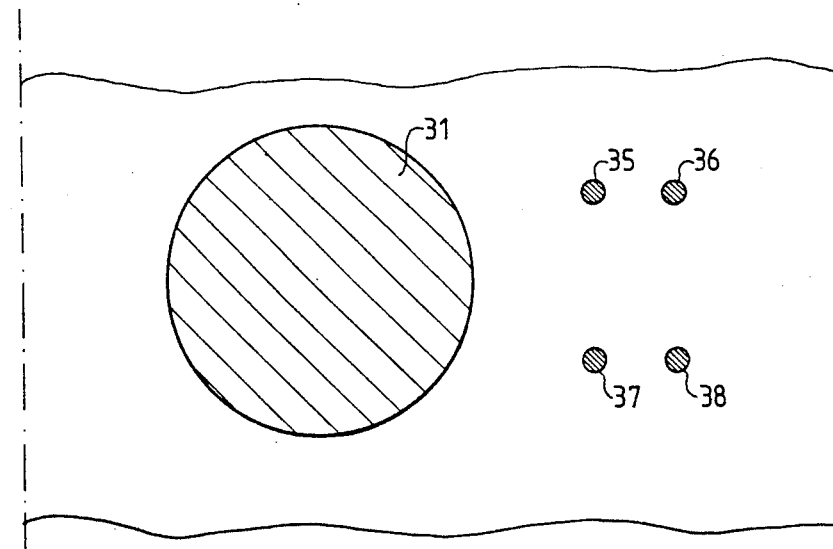
SECTION A-A    FIG. 7

MODULAR HYBRID MICROELECTRONIC STRUCTURES WITH HIGH DENSITY OF INTEGRATION

BACKGROUND OF THE INVENTION

1. Field of the Invention

The present invention concerns a modular, hybrid microelectronic structure which permits, notably, high density of integration.

2. Description of the Prior Art

The race to miniaturize electronic functions began in the very early nineteen sixties with the appearance of the first integrated circuits. Considerable advances were made in the designing and manufacture of monolithic integrated circuits. But these advances were less spectacular in the field of connections among integrated circuits.

A specific example will give us a clearer picture: let us consider a module manufactured around 1980, using 80 integrated circuits, encapsulated and mounted on a printed circuit with metallized holes. This module occupied a total area of about 270 cm2. Five years later, it was possible to obtain this same module with only one complex integrated circuit (with the method of monolithic integration of silicon), encapsulated and occupying a total area of 11.2 cm2. The area occupied by this module was thus reduced in a ratio of 1/23. This ratio of reduction in area can be broken down as follows: 1/15.3 for the reduction which can be attributed to silicon alone, and 1/1.5 for the reduction in area which can be attributed to the encapsulation of silicon and to the connections among the integrated circuits.

Thus, in spite of undeniable innovations in the field of encapsulations and connections, the advances made in this field are about ten times less significant than in that of silicon.

If we refer now, for the above-mentioned module, to hybridization on large areas, namely to the direct mounting of the 80 semiconductor chips, corresponding to the above-mentioned 80 integrated circuits, provided with their wiring on an interconnection substrate, an area of 32 cm2 is needed to make the module. Under these conditions, the efficiency of the hybridization, compared with that of monolithic integration of silicon, shows that it is three times higher in terms of the area occupied by the silicon on the interconnection substrate, but three times lower in terms of the reduction in the area of the interconnecion substrate.

Consequently, a major and unavoidable step concerns the hybridization of complex integrated circuits with a prospect of a high gain in area with respect to the printed circuit. Without overlooking complementary difficulties related to electrical testing, this prospect requires a revision of hybridization technologies, especially in the field of substrates.

An aim of the invention is the designing of a hybrid microelectronic structure which copes with these problems by making the best use of the different technologies available for making multiple layers, the choice of the substrates and of the width of the conductors, this width being capable of wide-ranging variation from 250 microns in thick-layer technology to 25 microns in thin-layer technology.

The preponderant factors in the hybrid integration of electronic modules reveal the following "parameters" in decreasing order of importance:

first of all, the "density of integration", which is a relationship between the mean number of connections made, per unit of substrate area, designed for the interconnection of the electronic components. The integration density varies in a ratio of 100/1 for hybrids. It depends greatly on the choice of the silicon chips of the active circuits;

the design rules, characterized by the "pitch" which is the minimum distance, permitted by the technology of the substrate used, between the median lines of two coplanar conductors. This distance is equal to the sum of the minimum permitted width of the conductors and the minimum insulation width required between two adjacent conductors. The pitch varies in a ratio of 10 for the hybrids. It depends greatly on the technology of the interconnection substrate;

the "mean topological degree", namely factor making it possible to take into account the architecture of the interconnections according to an electrical diagram of the hybrid module. The mean topological degree varies between 1 and 2; it is the average number of conductors which radiate out of each interconnection node.

After the characterization of the connection scheme of the "substrate" by these parameters, the design elements of the substrate are deduced therefrom. These are the "number of layers", the "number of vias" or links perpendicular to the plane of the layers to connect these layers together electrically, and the construction technology of the substrate.

The hybrid circuits are designed on an insulating substrate which receives conductors and passive components by printing (silkscreen process) or by etching (photolithography). The active elements, formed by simple or complex integrated circuits, are laid on the substrate and then soldered or bonded. It is said that they are mounted. A distinction is made among three classes of hybrid circuits:

thin-layer (or thin-film) hybrid circuits, in which the superimposed layers are alternately conducting and insulating, are made by photolithography. Each layer has a maximum thickness of 10 microns (the usual abbreviation for a micrometer), the width of the conductors ranges between 10 and 30 microns and the pitch ranges between 30 and 100 microns. These hybrid circuits are limited by the small number of superimposed insulating layers that can be made (generally not more than five layers) because of technological difficulties and the resultant cost;

thick-layer (or thick-film) hybrid circuits in which the superimposed and alternately conducting and insulating layers are obtained by successive silkscreen process and baking operations. Each layer has a thickness of more than 10 microns. The width of the conductor is generally 250 microns, and the pitch is 500 microns. The limitations of these hybrid circuits lie in the maximum number (hardly more than six) of superimposed, insulated conducting layers and in the difficulty of wiring the connected semiconductor chips with poor planeity of the silkscreen printed elements. When the circuits are made of ceramic, it is practically impossible to make interconections between layers by vias;

thick-layer hybrid circuits in which the conducting layers are obtained by silkscreen printing on insulating layers, which are sheets of ceramic placed on top of one another, pressed, and then baked together all at once, after the drilling of interconnection vias between the layers and the silkscreen printing of the conductors.

These ceramic integrated circuits are said to be "co-baked". Since the number of insulating layers no longer represents a constraint, the limitations of these hybrid circuits arise out of the constraints related to the wiring of the semiconductor chips with a great number of input/output pads, the interval of which is far smaller than the minimum pitch of the circuits printed by silkscreen process (300 microns). The active elements used are placed on one or both faces of the co-baked type multilayer substrate with thick layers. The active elements are, for example, encapsulated, monolithic integrated circuits, and are in the form of semiconductor chips encapsulated collectively (standard hybrid circuits).

Furthermore, it is necessary, in thin multilayer hybrid circuit technology, to use circuits with very high integration density comprising, in particular, at least one semiconductor chip mounted on the thin multilayer substrate having a great number (possibly more than 100) of inputs/outputs, the interval of which is far smaller than the minimum pitch (about 300 microns) permitted by the state of the art for silkscreen printing in thick-layer technologies. The essential constraints imposed by these thin multilayer circuits are as follows:

the need for a substrate acting as a mechanical support for the thin layer; a ceramic material such as alumina is often used;

the making of more than three layers proves to be difficult and prohibitively costly;

the connection has to be made by wire connections between the thin-layer substrate and the outside;

the assembly has to be protected from the environment, especially from humidity, by being placed in a package through which the external connections system has to be provided.

An object of the invention is to reconcile thin-layer technologies with thick-layer technologies to improve the performance characteristics of a hybrid structure in terms of density of integration, notably when the circuits comprise semiconductor chips with a great number of inputs and outputs. It shall be seen further below that other advantages result from the invention, among others:

better local adaptation to the different densities of integration of the mounted circuits;

elimination of wiring at the edge of the thin-layer hybrid module;

optimum reduction of the number of thin layers;

optimum reduction of the number of conductive layers of the thick layers;

decoupling of the supplies made easier, without loss of area for the connections;

easy discharge of heat into the environment;

easy assembly and dismantling of the hybrid module with external interconnections which can be mechanically separated from the module.

SUMMARY OF THE INVENTION

According to the invention, there is made a modular, hybrid microelectronic structure with high integration density, comprising active, encapsulated microelectronic components mounted on at least one face of a thick-layer substrate, said structure further comprising at least one encapsulated hybrid circuit grouping, within itself, circuits with high integration density, formed by at least one semiconductor chip mounted on a substrate with thin layers, said thin layers being grown directly on one face of said thick-layer substrate, which is used by them as a mechanical support.

According to another characteristic of the invention, the interconnections among the various encapsulated components, mounted on one or both faces of the thick-layer substrate, can be made in volume within this substrate itself, in such a way that there is no external linking conductor, but only input/output terminals on the visible faces of the module.

Furthermore, within the composite substrate itself, the interconnections of the thin-layer substrate, directly mounted on the thick-layer substrate, with the electrical network internal to the thick-layer substrate, are made without wiring of thin layers to thick layers, by means of metallized vias, within the thin layers, electrically connected to metallized vias within the thick layers. These metallized vias are not necessarily distributed on the edge of the area occupied by the thin layers, but may be advantageously distributed throughout the area occupied by the thin layers in order to obtain the shortest connections.

The invention can be applied in any field which employs the principle of three-dimensional interconnections among the components, beneath or on said components. Valid areas of application include fields such as those of multilayer printed circuits with enclosing layers, co-baked ceramic thick multilayers and thin multilayers.

BRIEF DESCRIPTION OF THE DRAWINGS

FIGS. 6 and 7 are detailed drawings relating to the interconnections in the composite substrate formed by the thick-layer substrate and the thin-layer substrate.

DETAILED DESCRIPTION OF A PREFERRED EMBODIMENT

Figure 1:
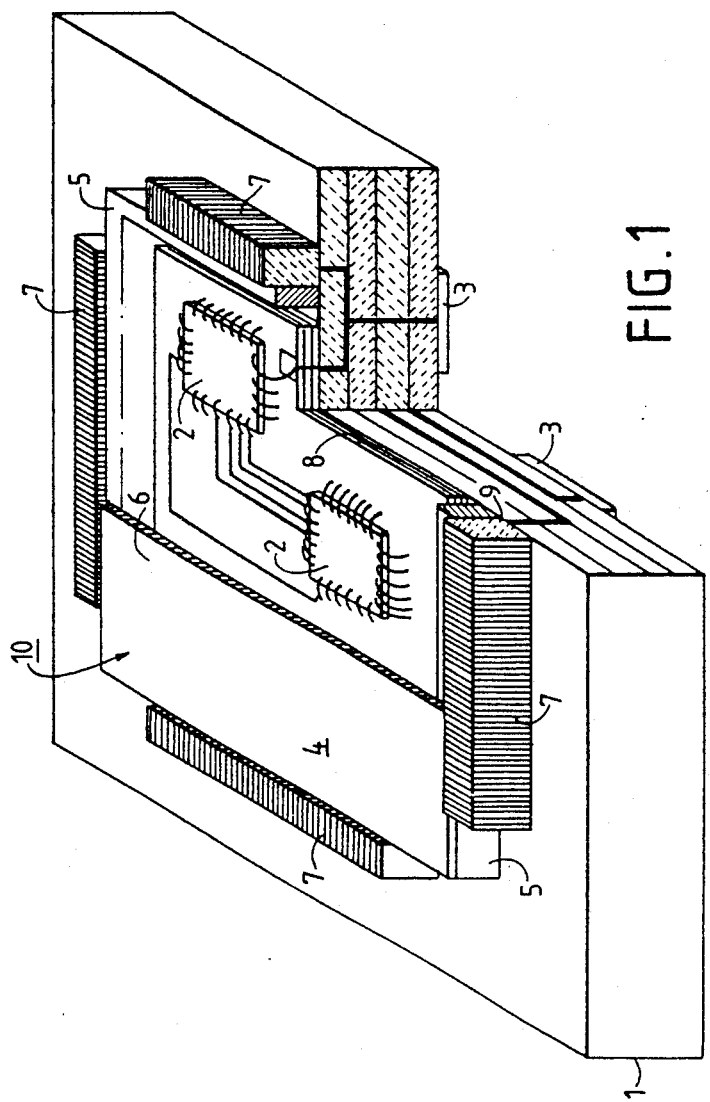
FIG. 1 is a drawing of a hybrid structure according to the invention.

The exemplary embodiment of a modular hybrid structure according to the invention, shown in the figures, corresponds to a preferred but non-restrictive embodiment as shall be seen further below.

According to this preferred embodiment, the module consists of a multilayer substrate 1 supporting, on one face, semiconductor chips 2 with high density of integration. On the other face, there are placed integrated circuits with a lower density of integration, available in the form of electronic components 3 encapsulated and mounted on this face.

The chips 2 are collectively encapsulated in a package 4 which may be formed by a frame 5 and a cover 6.

The semiconductor chips 2 are interconnected by means of a substrate 8 made with thin-layer technology, which can be preferably used for circuits of this type with high density of integration. The number of thin layers is preferably restricted to 1, 2, 3 or 4 at the most, in view of the high cost and difficulty of manufacturing where there are more than four layers. These thin layers are developed successively on the corresponding face of the substrate 1, preferably in the following order:

the thin layer at the deepest level is the layer for bonding the interconnection vias to the electrical network of the substrate 1 on its corresponding face, the next thin layer is located above the bonding layer with conductors parallel to one of the sides of the substrate 8, the next thin layer has conductors perpendicular to the previous ones, and the topmost thin layer is that on which are mounted the semiconductor chips 2 and, as the case may be, other electronic components.

The set 2-8, placed beneath the package 8, forms an encapsulated, hybrid circuit 10 mounted on one face of the supporting substrate 1.

The substrate 1 uses thick-layer technology. It is preferably based on sheets of co-baked ceramic formed by aluminium, glass, cordierite or, better still, aluminium nitride or similar. The substrate forms the mechanical support of all the mounted circuits, particularly at least one encapsulated set 2 and 8 with high density of integration. The substrate 1 also physically achieves the electrical network interconnecting the mounted components and, in particular, the interconnection with the encapsulated set or sets, 2 and 8, with high integration density. It further forms a heat sink with high conductibility if it is based on aluminium nitride or an equivalent material. Other functions are provided by this substrate 1 which enables efficient decoupling of supplies and internal combining of interconnections with high current intensity and interconnections between the two faces and towards the exterior.

If necessary, the components 3 may be distributed among the two faces of the substrate 1. Similarly, the hybrid set 2+8, with high integration density, may be reproduced on or distributed among the two faces, or at several places on one face, depending on the complexity and most advantageous design which will be chosen to make the module.

Figure 2:
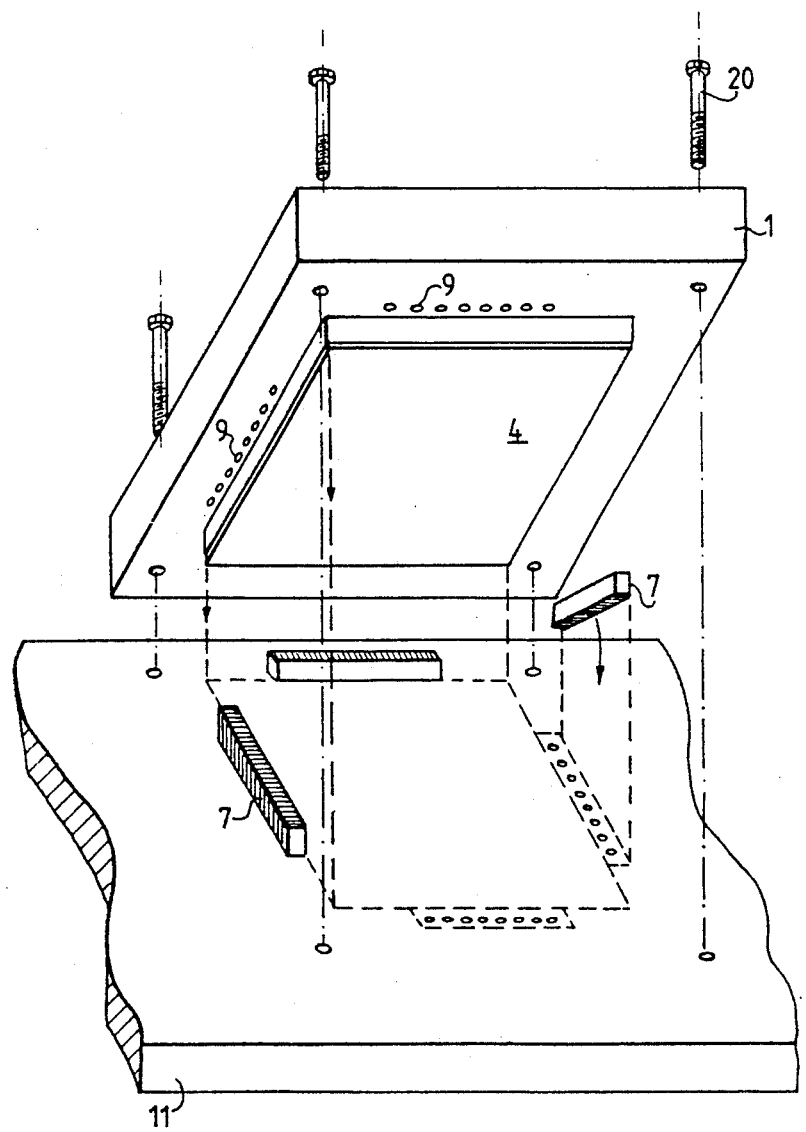
FIG. 2 is a drawing relating to the assembly or disassembly of the structure according to FIG. 1.

The outward interconnections are made by input-/output pads 9 on the substrate 1 As can be seen in the section made in FIG. 1, these inputs/outputs are connected to the components 2 and 3 by connections buried in the substrate 1. The input and output terminals 9 are preferably grouped together at the periphery of the package 4 (FIG. 2) and the outward connections are not made by wires but by means of an elastomer connection 7, the structure 4 being, at least externally, electrically insulating. The elastomer conductors 7 are not solidly joined to the modular structure. They are introduced during the assembly operation as can be seen in FIG. 2.

Figure 3:
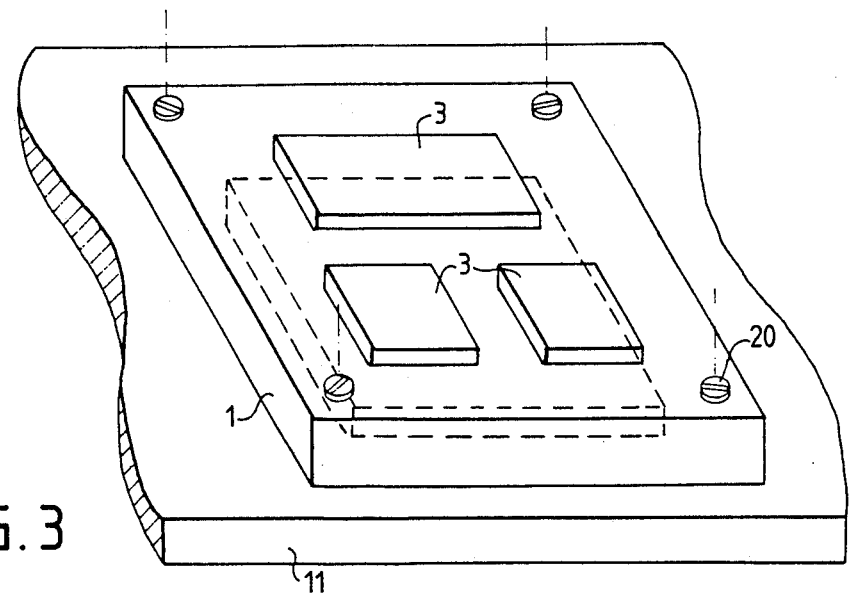
FIG. 3 is a perspective view of the modular, hybrid structure, according to the invention, after assembly.
Figure 4:
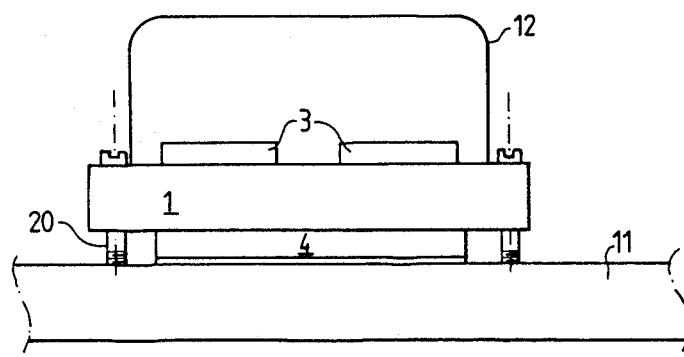
FIG. 4 is a side view of the modular, modular structure according to the invention, after assembly, showing notably the possiblity of easily adding a heat sink for heat dissipation.

The module thus obtained has no visible outside wires, and provides for easy assembly and dismantling. The fixing is done, for example, by means of four screws (FIGS. 2, 3 and 4).

The dense circuits 10 formed with the semiconductor chips 2 on a thin-layer substrate 8 are preferably grouped together on one face of the substrate 1 and collectively encapsulated by the package 4; the less dense circuits 3 or additional components may be transferred to the thick-layer substrate 1 on the other side. These components 3 are flat mounted, and preferably chosen so as to be encapsulated without external interconnecting pins, with external metallization in order to be bonded or soldered. The semiconductor 2 chips are connected to the internal electrical network of the thin-layer substrate 8, or else they are connected by wires soldered at their periphery according to the standard semiconductor technology or else, again, by using the method wherein the chips are turned over and soldered directly to the substrate 8 or, yet again, by the so-called technique for thin-layer collective wiring of chips after planarization.

The thin-layer technique provides for great fineness in the quality of conductors. The width of these conductors is about 25 microns, so much so that it is especially suited to the making of the electrical network of the logic signals exchanged among large scale integrated circuits.

By contrast, this method is costly for the making of high current density conductors (supplies, ground, etc.).

In the thick-layer technique, use is made of conductors which are wide (for example 250 microns wide) and which therefore favor the making of high current density conductors or the making of connections among low or medium scale integration circuits. This latter technique is costly, or even impossible, to use for application with very high density interconnections which would require an excessively large number of layers.

The module thus enables local adaptation to different densities of integration of components. According to FIGS. 2 to 4, the entire module is mounted flat on an external support 11, for example a printed circuit, and is mounted in the inverted position as regards the semiconductor chips 2 in the package 4, this package being placed on the printed circuit 11 side.

The lid or cover 6 is either bonded or soldered to the frame 5, depending on the materials used. With a metallic frame, the cover could be soldered but the frame and the cover should, in this case, be electrically insulated on the outside, for example by means of a varnish. Ceramic may also be used to form the frame 5 and the cover. This cover may be bonded to the frame 5. The frame 5 may be made so as to form a single piece with the substrate 1 by making it during the multilayer pressing operation.

The assembly obtained, as shown in FIG. 3, reveals, in the inverted position, the ease with which the heat is discharged by means of the substrate 1 which forms a good heat sink, especially if it is made of aluminium nitride. This heat exchange is facilitated with the environment, and does not require any special precautions for the printed circuit 11 side. To further increase the heat exchange, it is possible, as shown in FIG. 4, to easily lay a heat sink 12 on the upper side bearing the components 3.

The elements 7 of the detachable, external interconnections are positioned in the substrate 1, in providing, for example, for the making of walls or grooves on the printed card 11.

The package 4 is designed to be imperviously tight for usual applications and hermetically sealed for military applications requiring greater imperviousness.

The criteria relating to the choice of the method are more especially:

the search for a minimum number of layers to process the signals and facilitate the manufacture of the set;

the response speed of the signals which requires low dielectrical constants for fast signals and, therefore, the use of an organic (for example polyimide) or mineral (for example $SiO_2$) thin-layer technology;

the heat discharge;

the decoupling of the supplies by forming decoupling capacitors in the thick-layer substrate, it being possible to make these capacitors in thin layers only at the cost of great complexity entailing high costs.

Figure 5:
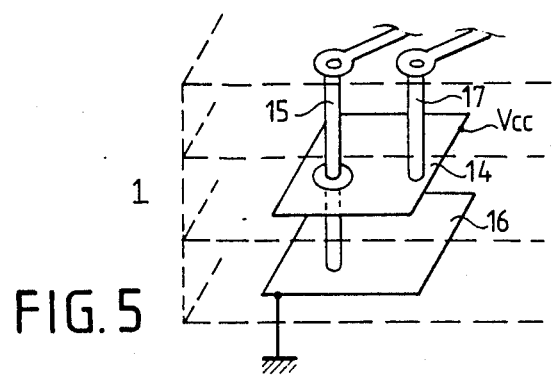
FIG. 5 is a drawing relating to the decoupling of the supplies, which can be achieved in the thick-layer substrate of the modular structure according to the invention.

FIG. 5 shows the making of a decoupling capacitor of this type in the substrate 1 by means of large area metallizations 14 and 16 on two layers, one connected to the ground and the other to the dc voltage $V_{cc}$, and shows the crossings by vias 15, 17 to go up to the corresponding conductors.

The thin-layer substrate 8 is achieved by the deposition of an organic or mineral layer, and then by the deposition of conductors on this layer. The operation for depositing an insulating layer, coated with a second layer of conductors, is repeated as many times as there are thin layers necessary for the intercommunication of the chips 2.

The operation to deposit an organic layer may be done by centrifugation followed by a baking operation and a polymerizing operation (by means of exposure to ultraviolent rays for example).

A mineral layer may be deposited chemically, by oxidation for silicon dioxide ($SiO_2$) or by means of plasma techniques in the case, for example, of silicon nitride.

The metallic coating operation may be achieved by vacuum evaporation or by cathode sputtering of pure metals on the organic or mineral insulating layer, and then etching by plasma.

The interconnection vias between metallized layers are made by plasma etching of the upper insulating layer, and then metallized during the metallic coating of this layer.

The module thus formed has no visible wires and there is a total absence of visible connections on the faces, since the interconnections among the chips 2 are made inside the package 4, and the interconnections with and among the components 3 are made by means of vias through the internal layers of the substrate 1.

The only visible elements are the input/output contacts 9, intended for making the external connections by means of the detachable, elastomer connector elements 7. These connectors 7 are made in a known way, by C-shaped conductor loops laid out on an insulating support with a small pitch as compared with that of the connections to be made, for example a pitch about one third that of the successive contacts 9 to be connected to the exterior. Thus, a low amplitude longitudinal shift by these connectors 7 does not disturb the achieving of coincidence with the points to be connected.

The module thus formed stands up very well to environmental conditions, especially to humidity, since the various components 3 are encapsulated, as are all the chips 2 in the package 4, which also shields the thin-layer substrate 8 from the environment.

The components 3 are preferably chosen without interconnection lugs, in using a co-heated substrate 1, well suited in terms of thermal expansion to circuits of this type.

FIG. 6 shows a detailed drawing of the interconnection between the thin-layer substrate 8 and the thick-layer substrate 1. FIG. 7 refers to the section AA indicated. The interconnections are made by means of vias perpendicular to the thick layers. The figure shows a via 31 which may be made of silver. This via goes slightly over the upper face 32 of the thick layers on which the first layer, called the bonding layer of the multilayer substrate to the thin-layer substrate 8, has been deposited directly. Before performing this operation, a layer of bonding metal 33 is deposited on the ceramic and on the end of the via. Inside the thin-layer substrate 8, there is shown a horizontal conducting link 34 (deposited on an insulating layer and placed between two insulating layers; for simplicity's sake, the insulating layers have not been shown) which may be made of aluminium and which is connected vertically, by means of an aluminium via 35, to the metallic bonding layer 33. Another via 36 to achieve other interconnections is shown. FIG. 7 shows, in the sectional plane, the large diameter via 31 which is located in the thick-layer substrate essentially, and the vias 35 and 36, with far smaller diameters, as well as two other vias, 37 and 38 made within thin layers.

What is claimed is:

1. A modular, hybrid microelectronic structure with high integration density, comprising active, encapsulated microelectronic components mounted on at least one face of a thick-layer substrate, said structure comprising:
    a first multilayer substrate having on a first face at least one encapsulated microelectronic component, and a first density of individual wiring patterns; and
    supported by a second face of said first substrate, a second multilayer substrate having at least one high integration density component, and a second density of individual wiring pattern of greater density than the first wiring pattern density of the first substrate.

2. A structure according to claim 1, comprising a single, encapsulated, hybrid circuit borne by one face and said encapsulated, active, microelectronic components borne by the other face of the thick-layer substrate.

3. A structure according to claim 1, wherein said active components are encapsulated, monolithic, integrated circuits.

4. A structure according to claim 1, wherein the thick-layer substrate is made of co-baked ceramic.

5. A structure according to claim 1, wherein the interconnections among the encapsulated components, borne by the two faces of the thick-layer substrate, are within this very substrate itself, so that there is no visible, connecting conductor on the faces of the substrate.

6. A structure according to claim 1, wherein interconnections between the thin-layer substrate and the thick-layer substrate have no wiring but have vias.

7. A structure according to claim 6, wherein the interconnecting vias between thin layers and thick layers are distributed throughout the area of the thin-layer/thick-layer interface.

8. A structure according to claim 1, wherein the interconnections between the various encapsulated components, borne by the two faces of the thick-layer substrate, and the exterior, are within this very substrate itself, to end at input/output terminals ending at one of the faces of said thick-layer substrate, in such a way that there appears no external connecting conductor on the faces of this substrate but only these input/output terminals.

9. A structure according to claim 8, wherein said input/output terminals are distributed on the periphery of the hybrid structure, outside and in the vicinity of a package covering said hybrid circuit in a tightly sealed way.

10. A structure according to claim 9, wherein the external connections of said input/output terminals are made by means of removable, elastomer connectors which are introduced during the assembly of the modular structure.

11. A structure according to claim 8, mounted so as to present a hybrid circuit beneath the thick-layer substrate and the encapsulated, active components on top of this substrate.

12. A structure according to claim 11, comprising a heat sink placed on the face bearing said active components.

13. A structure according to claim 1, wherein means for dc supply capacitive decoupling are made within the thick-layer substrate itself.

14. A structure according to claim 1 wherein the second multilayer substrate is made of organic polymer layers.

15. A structure according to claim 14 wherein the organic polymer is polyimide.

* * * * *